United States Patent
Roy et al.

(10) Patent No.: US 9,117,754 B2
(45) Date of Patent: Aug. 25, 2015

(54) METHODS FOR EXTENDING FLOATING GATES FOR NVM CELLS TO FORM SUB-LITHOGRAPHIC FEATURES AND RELATED NVM CELLS

(71) Applicants: Anirban Roy, Austin, TX (US); Craig A. Cavins, Pflugerville, TX (US)

(72) Inventors: Anirban Roy, Austin, TX (US); Craig A. Cavins, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/168,093

(22) Filed: Jan. 30, 2014

(65) Prior Publication Data

US 2015/0214062 A1    Jul. 30, 2015

(51) Int. Cl.
| | |
|---|---|
| *H01L 27/115* | (2006.01) |
| *H01L 21/28* | (2006.01) |
| *H01L 29/49* | (2006.01) |
| *H01L 29/423* | (2006.01) |
| *H01L 29/66* | (2006.01) |
| *H01L 27/112* | (2006.01) |

(52) U.S. Cl.
CPC ........ *H01L 21/28273* (2013.01); *H01L 27/112* (2013.01); *H01L 27/115* (2013.01); *H01L 27/11517* (2013.01); *H01L 27/11548* (2013.01); *H01L 27/11563* (2013.01); *H01L 27/11568* (2013.01); *H01L 29/42324* (2013.01); *H01L 29/42336* (2013.01); *H01L 29/4916* (2013.01); *H01L 29/66825* (2013.01)

(58) Field of Classification Search
CPC ................... H01L 27/11517; H01L 27/11548; H01L 27/112; H01L 27/115; H01L 27/11563; H01L 27/11568; H01L 29/66825; H01L 29/4916; H01L 29/42324; H01L 29/42336; H01L 21/28273

See application file for complete search history.

(56) References Cited

U.S. PATENT DOCUMENTS

| 5,108,939 A | * | 4/1992 | Manley et al. ................. 438/594 |
| 5,338,952 A | * | 8/1994 | Yamauchi ................. 365/185.15 |
| 5,478,767 A | * | 12/1995 | Hong .............................. 438/267 |
| 5,494,838 A | * | 2/1996 | Chang et al. .................. 438/264 |

(Continued)

OTHER PUBLICATIONS

Beug, M. F. "Pitch Fragmentation Induced Odd/Even Effects in a 36 nm Floating Gate NAND Technology" Non-vol. Mem. Tech. Symp. 2008, Nov. 14, 2008 pp. 1-5.*

(Continued)

*Primary Examiner* — Matthew Landau
*Assistant Examiner* — Grant Withers
(74) *Attorney, Agent, or Firm* — Egan, Peterman & Enders LLP.

(57) ABSTRACT

Methods are disclosed for extending floating gate regions within floating gate cells to form sub-lithographic features. Related floating gate cells and non-volatile memory (NVM) systems are also disclosed. In part, the disclosed embodiments utilize a spacer etch to form extended floating gate regions and floating gate slits with sub-lithographic dimensions thereby achieving desired increased spacing between control gate layers and doped regions underlying floating gate structures while still allowing for reductions in the overall size of floating-gate NVM cells. These advantageous results are achieved in part by depositing an additional floating gate layer over previously formed floating gate regions and then using the spacer etch to form the extended floating gate regions as sidewall structures and sub-lithographic floating gate slits. The resulting floating gate structures reduce breakdown down risks, thereby improving device reliability.

13 Claims, 5 Drawing Sheets

(56) References Cited

U.S. PATENT DOCUMENTS

| | | | |
|---|---|---|---|
| 5,650,345 A | 7/1997 | Ogura et al. | |
| 5,970,342 A * | 10/1999 | Wu | 438/260 |
| 6,069,382 A * | 5/2000 | Rahim | 257/316 |
| 6,083,846 A * | 7/2000 | Fulford et al. | 438/740 |
| 6,153,494 A * | 11/2000 | Hsieh et al. | 438/424 |
| 6,204,122 B1 * | 3/2001 | Joo et al. | 438/257 |
| 6,232,185 B1 * | 5/2001 | Wang | 438/266 |
| 6,803,620 B2 * | 10/2004 | Moriya et al. | 257/298 |
| 6,808,989 B2 | 10/2004 | Hurley et al. | |
| 2002/0130357 A1 * | 9/2002 | Hurley et al. | 257/321 |
| 2002/0197798 A1 * | 12/2002 | Hurley et al. | 438/264 |
| 2004/0191990 A1 * | 9/2004 | Kianian et al. | 438/257 |
| 2004/0214396 A1 * | 10/2004 | Wang et al. | 438/266 |
| 2005/0104115 A1 * | 5/2005 | Kianian | 257/314 |
| 2005/0215009 A1 * | 9/2005 | Cho | 438/257 |
| 2006/0003182 A1 * | 1/2006 | Lane et al. | 428/688 |
| 2006/0008981 A1 * | 1/2006 | Wang et al. | 438/257 |
| 2009/0309153 A1 * | 12/2009 | Yanagi et al. | 257/324 |
| 2012/0132978 A1 * | 5/2012 | Toba et al. | 257/316 |
| 2014/0239367 A1 * | 8/2014 | Saito et al. | 257/319 |

OTHER PUBLICATIONS

Fastow et al., "A 45nm NOR Flash Technology With Self-Aligned Contacts and 0.024 $\mu m^2$ Cell Size for Multi-Level Applications", IEEE, 2 pgs. (2008).

Park et al., "A 70nm NOR Flash Technology With 0.049 $\mu m^2$ Cell Size", Symposium on VLSI Technology Digest of Technical Papers, 2 pgs. (2004).

Piazza et al., "High Performance Flash Memory for 65 nm Embedded Automotive Application", IEEE, 3 pgs. (2010).

\* cited by examiner

US 9,117,754 B2

METHODS FOR EXTENDING FLOATING GATES FOR NVM CELLS TO FORM SUB-LITHOGRAPHIC FEATURES AND RELATED NVM CELLS

TECHNICAL FIELD

This technical field relates to floating-gate non-volatile memory (NVM) cells for NVM systems.

BACKGROUND

Floating gate cells are used for many non-volatile memory (NVM) systems. A floating-gate NVM cell typically includes a source region, a drain region, a floating gate, and a control gate positioned above the floating gate. Wordlines for rows of floating-gate NVM cells are formed using control gate layers. During operation, charge is added to or removed from the floating gate to determine its logic state. To reduce the size of floating-gate NVM cell arrays, it is desirable to reduce the feature sizes for the floating gates for the floating-gate cells.

FIG. 1 (Prior Art) is a top view diagram of an example embodiment 100 for a floating gate cell area. A drain contact 104 has been formed within a drain region 102, and a source contact 108 has been formed within a source region 106. A floating gate 114 is positioned between the source region 106 and the drain region 102 underneath the control gate (CG) layer, only portions 112 for which are shown. For the embodiment 100 depicted, the floating gate 114 includes wing portions 120 that extend over STI (shallow trench isolation) regions 110 that are positioned adjacent the edges of the floating gate, source region 106, and drain region 102. The floating gate area is defined in part by the area represented by a product of the channel length (L) 116 and the channel width (W) 118 plus the wing portions 120. Shrinking of these floating gate dimensions is desirable to reduce the size of the overall cell array FIG. 2 (Prior Art) is a cross-section view diagram of an embodiment 200 along dashed line 122 in FIG. 1 (Prior Art). A doped well region 202 has been formed within a semiconductor substrate along with STI regions 110. A gate oxide 210 is positioned above the well region 202, and a floating gate (FG) 114 has been formed over the gate oxide 210. The floating gate layer used to form the floating gate 114 is typically deposited and then patterned using a lithography tool to form slits on either side of the floating gate. The dimensions 212 for these floating gate slits, therefore, are dependent upon the lithographic dimensions allowed by the tool. A dielectric layer 208, such as an oxide layer, is formed over the floating gate 114 and the STI regions 110. A control gate (CG) layer 112 is then formed over the dielectric layer 208. Although not shown, additional well regions and floating gates would be positioned on either side of the floating gate (FG) 114 and well region 202 if an array of floating-gate NVM cells were being formed during manufacture.

As can be seen, if dimensions for the floating gate 114 are reduced, the control gate layer 112 within the floating gate slits is also moved closer to the doped well region 202. This reduced distance between the control gate layer 112 and the doped well region 202 within the floating gate slits may lead to lower breakdown voltages within regions 220 and 222. This reduced breakdown voltage can in turn cause performance degradations and reduced reliability for resulting floating-gate NVM cell arrays. Prior solutions attempt to reduce this breakdown risk by forming control gate and/or floating gate structures that require the use of higher resolution lithography tools that allow reduced feature sizes. These higher resolution lithography tools, however, add undesirable complexity and cost to the manufacturing process.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a top view diagram of an example embodiment for a floating-gate cell area within floating-gate cell arrays.

DETAILED DESCRIPTION

Methods are disclosed for extending floating gate regions within floating-gate NVM (non-volatile memory) cells to form sub-lithographic features. Related NVM cells and integrated circuits are also disclosed. In part, the disclosed embodiments utilize a spacer etch to form extended floating gate regions and sub-lithographic floating gate slits thereby achieving desired increased spacing between control gate layers and doped regions underlying the floating gate structures while still allowing for reductions in the overall size of floating-gate NVM cells. As described herein, these advantageous results are achieved in part by depositing an additional floating gate layer over previously formed floating gate regions and then using the spacer etch to form the extended floating gate regions as sidewall structures and sub-lithographic floating gate slits. The spacer floating gate material effectively merges with the initial floating gate material to form combined floating gate structures that provide the sub-lithographic floating gate slits and increased distances between control gate layers and doped well regions underlying the floating gates. Because the tunneling distances from the control gate layers to the doped well regions underlying the floating gate structures are increased, breakdown risks are reduced. As such, the overall size of the NVM cell array can be reduced without requiring additional and expensive high resolution lithography tools and without causing increased breakdown risks during high voltage operations. Different features and variations can also be implemented and related or modified systems and methods can be utilized, as well.

Figure 1:
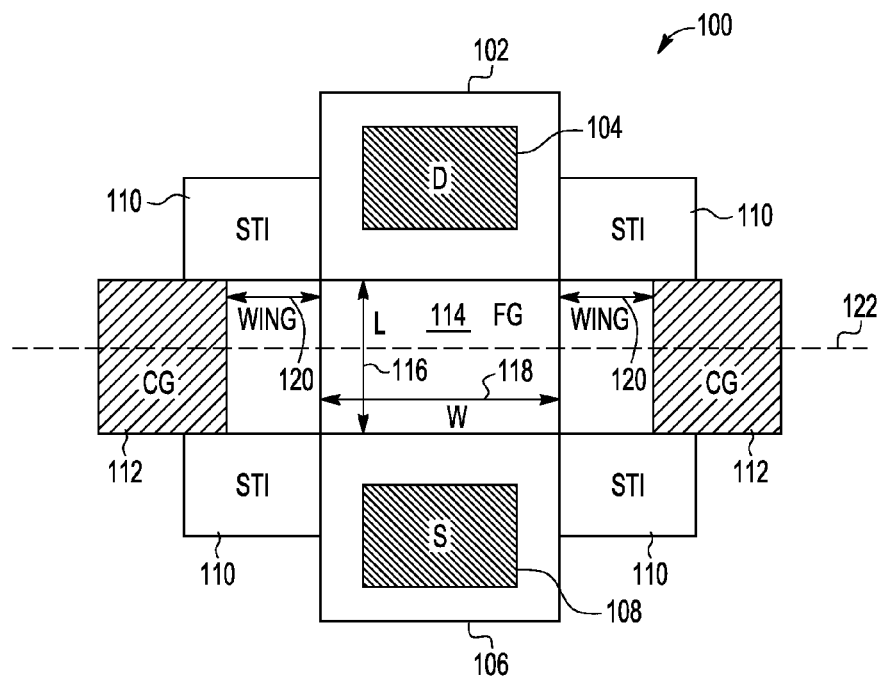
Figure 2:
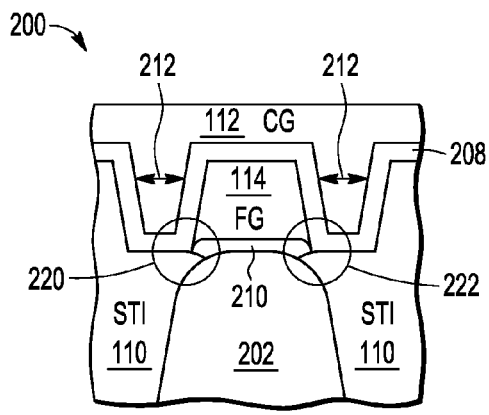
FIG. 2 (Prior Art) is a cross-section view diagram of the floating-gate cell shown in the embodiment of FIG. 1 (Prior Art).
Figure 3:
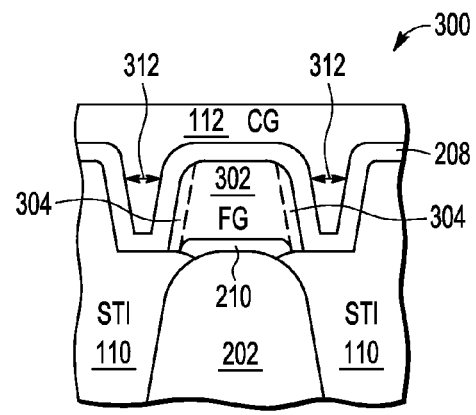
FIG. 3 is a cross-section view diagram of an embodiment where extended floating gate regions have been formed using a spacer etch to expand previously formed floating gate regions.

FIG. 3 is a cross-section view diagram of an embodiment 300 where extended floating gate regions 304 have been formed to expand previously formed floating gate regions 302. As with embodiment 200 of FIG. 2 (Prior Art), a doped well region 202 has been formed within a semiconductor substrate along with STI (shallow trench isolation) regions 110, and a gate oxide 210 is positioned above the well region 202. In addition, a floating gate (FG) region 302 similar to floating gate 204 in FIG. 2 (Prior Art), has also been formed over the gate oxide 210. As with floating gate 204, the floating gate region 302 can be formed by depositing a floating gate material layer, patterning the floating gate material layer using a lithography tool, and then etching the floating gate material layer. However, unlike embodiment 200 of FIG. 2 (Prior Art), an additional floating gate layer is deposited and etched using a spacer etch and/or other etch processing step(s) to form extended floating gate regions 304 that expand the floating gate regions 302. As such, the dimensions 312 for the floating gate slits between the resulting floating gate structures 302/304 are not determined by the feature dimensions allowed by the lithography tool. Rather, dimensions 312 are sub-lithographic and are controlled by the spacer etch and/or other etch processing step(s), as described in more detail below. As with embodiment 200 of FIG. 2 (Prior Art), a dielectric layer 208, such as an oxide layer, is formed over the floating gate regions 302/304 and the STI regions 110. A control gate (CG) layer 112 is then formed over the dielectric layer 208. Although not shown, additional well regions and floating gate regions would be positioned on either side of the floating gate regions 302/304 and doped well region 202 if an array of floating-gate NVM cells are being formed during manufacture.

As can be seen, the sub-lithographic dimensions 312 provided by the spacer etch formation of the extended floating gate regions 304 increase the distance between the control gate and the doped well region 202. As such, breakdown is less likely to occur. This reduced breakdown risk leads to improved performance and reliability for resulting floating-gate NVM systems. Advantageously, the disclosed embodiments do not require the use of additional and expensive higher resolution lithography tools.

It is noted that the semiconductor substrate within which the doped wells regions 202 and STI regions 110 are formed, as described herein, can be any desired semiconductor material or combinations of materials, such as gallium arsenide, silicon germanium, silicon, monocrystalline silicon, other semiconductor materials, and combinations of these semiconductor materials. It is also noted that the semiconductor substrate represents the top portion of a semiconductor substrate. It is further noted that the semiconductor substrate described herein could be formed on top of other substrate materials including a separate non-semiconductor material, if desired, such as thin film semiconductor substrates formed on other semiconductor or non-semiconductor materials. For example, semiconductor-on-insulator (SOI) embodiments could be used. Further variations could also be implemented.

Looking now to FIGS. 4-9, these drawings provide example process steps for formation of the extended floating gate regions 304 using spacer etch processing steps and/or other processing steps.

Figure 4:
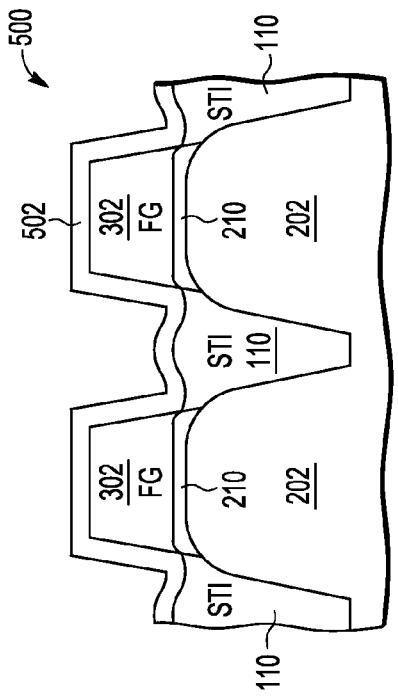
FIG. 4 is a cross-section view diagram of an embodiment after formation of the floating gate regions for two floating gate cells.

FIG. 4 is a cross-section view diagram of an embodiment 400 after formation of the floating gate regions 302 for two floating-gate NVM cells. As described above, doped well regions 202, STI regions 110, and gate oxide layers 210 can be formed with respect to a semiconductor substrate prior to formation of the floating gate regions 302. As indicated above, the floating gate regions 302 can be formed by forming a layer of floating gate material, such as doped polysilicon, and then patterning and etching this layer to form the floating gate regions 302. For the patterning, a lithography tool can be used to pattern a photoresist layer that is deposited over the floating gate material layer. This patterned photoresist layer can then be used to protect desired regions during an etch processing step. After the etch processing step and removal of the photoresist layer, the floating gate regions 302 are left. As described with respect to embodiment 200 of FIG. 2 (Prior Art), floating gate slits between the floating gate structures will have a dimension 212 that are limited by the resolution and allowable feature sizes of the lithography tool. It is further noted that source and drain regions are not shown and would be formed within the doped well region 202 in front of and behind the cross-section depicted in FIG. 4.

Figure 5:
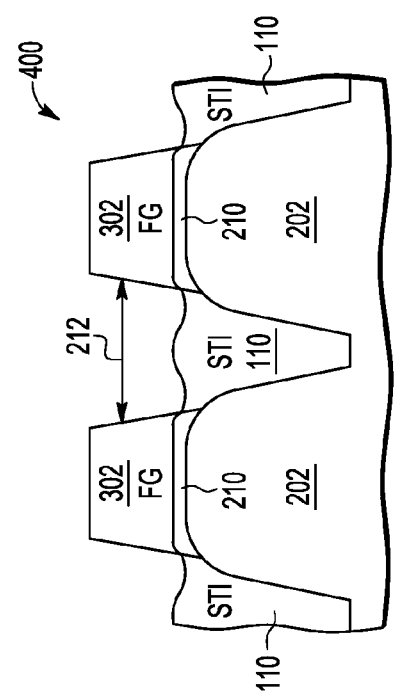
FIG. 5 is a cross-section view diagram of an embodiment after formation of an additional floating gate layer.

FIG. 5 is a cross-section view diagram of an embodiment 500 after formation of an additional floating gate layer 502. As shown, the additional floating gate layer 502 is formed over the floating gate regions 302. The additional floating gate layer 502 can be the same material as the floating gate regions 302, such as doped polysilicon, although other materials could also be utilized, if desired. Further, the doping concentration for the additional floating gate layer 502 can be made to be the same as the doping concentration for the floating gate regions 302, if desired, although different doping concentrations could also be utilized. Other variations could also be implemented.

Figure 6:
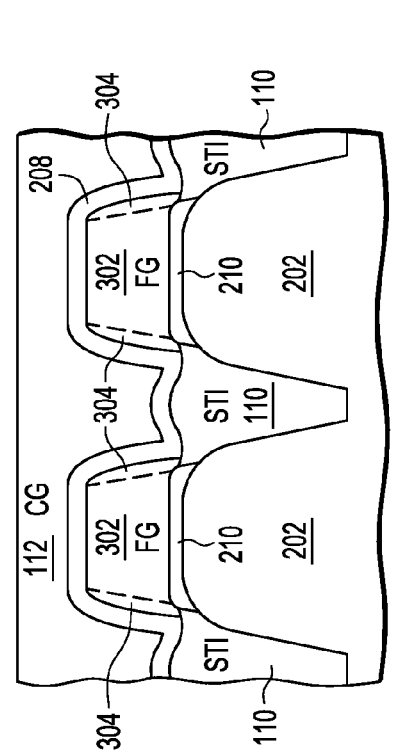
FIG. 6 is a cross-section view diagram of an embodiment after a spacer etch processing step has been used to etch the additional floating gate layer and to form the extended floating gate regions as sidewall structures for the floating gate regions.

FIG. 6 is a cross-section view diagram of an embodiment 600 after a spacer etch processing step 602 has been used to etch the additional floating gate layer 502 and to form the extended floating gate regions 304 as sidewall structures for the floating gate regions 302. As described above, floating gate slits between the resulting floating gate structures 302/304 will have a reduced dimension 312 that is not limited by the resolution or allowable feature size of the lithography tool. Rather, this dimension 312 is sub-lithographic and is dependent upon the spacer etch processing step 602. Preferably, the spacer etch is performed using an anisotropic etch without intervening protective patterning steps. For example, where doped polysilicon is used for the additional floating gate layer 502, the etch processing step 602 can be implemented by performing an anisotropic etch using an etch process such as a plasma etch with hydrogen bromide (HBr), chlorine ($CL_2$), and/or other etchants. The etch processing step 602 can also be a timed etch, if desired, so that a desired amount of floating gate material is etched from above the initial floating gate regions 302. Further, an etch stop can be used as described in more detail with respect to FIG. 8 below. Other processing steps, including patterning and/or additional etch processing steps, could also be utilized, if desired, while still using a spacer etch processing step 602 to form extended floating gate regions 302 and sub-lithographic floating gate slits.

Figure 7:
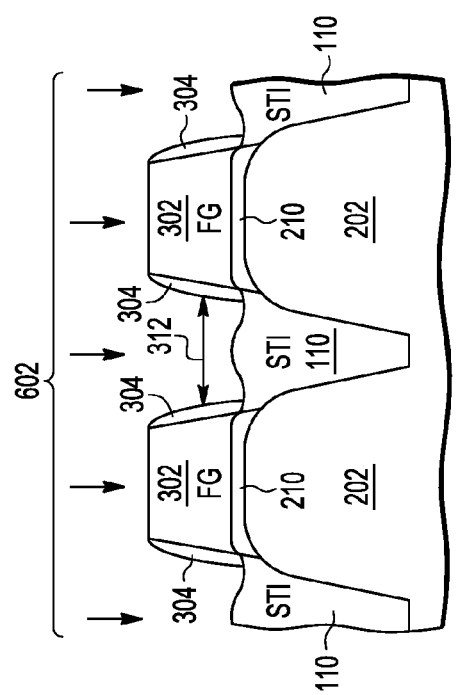
FIG. 7 is a cross-section view diagram of an embodiment after formation of a control gate layer and an intervening dielectric layer.

FIG. 7 is a cross section view diagram of an embodiment 700 after formation of control gate layer 112 and intervening dielectric layer 208. The dielectric layer 208 can be, for example, an oxide-nitride-oxide (ONO) dielectric layer and/ or another desired dielectric material. The control gate layer 112 can be doped polysilicon and/or another desired conductive material. It is noted that the extended floating gate regions 304 effectively merge with the floating gate regions 302 to become integral parts of the combined floating gate structures. This merging is represented in embodiment 700 by the dashed lines separating the floating gate regions 302 from the extended floating gate regions 304. The combined floating gate structures 302/304 effectively increase the distance between the control gate layer 112 and the doped well regions 202 thereby reducing breakdown risks. It is also again noted that source and drain regions are not shown and would be formed within the doped well region 202 in front of and behind the cross-section depicted in FIG. 7.

Figure 8:
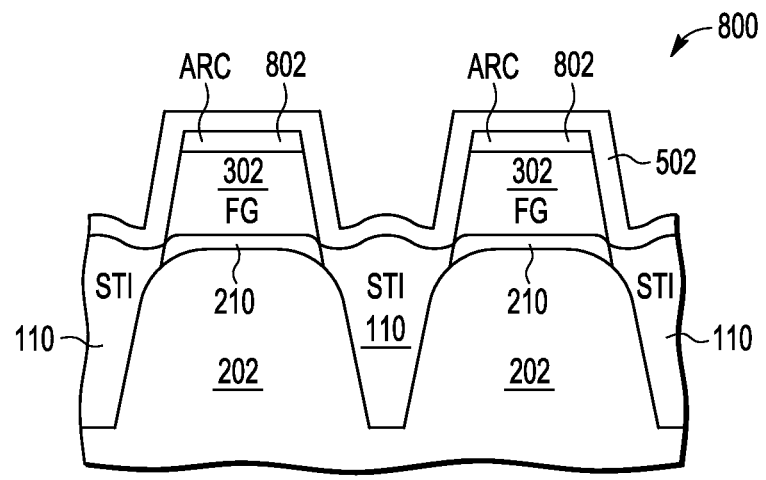
FIG. 8 is a cross-section view diagram of an embodiment where additional anti-reflective coating (ARC) layers are formed and left above the floating gate regions to provide an etch stop.

FIG. 8 is a cross-section view diagram of an embodiment 800 where additional anti-reflective coating (ARC) layers 802 are formed and left above the floating gate regions 302 to provide an etch stop. ARC layers 802 can be used during patterning and etching of the floating gate regions 302. These ARC layers 802 can be removed prior to forming the additional floating gate layer 502, as shown with respect to FIGS. 4-5. However, the ARC layers 802 can also be left above the floating gate regions 302, as shown in FIG. 8. These ARC layers 802 can then be used to provide an etch stop for etching of the floating gate layer 502.

Figure 9:
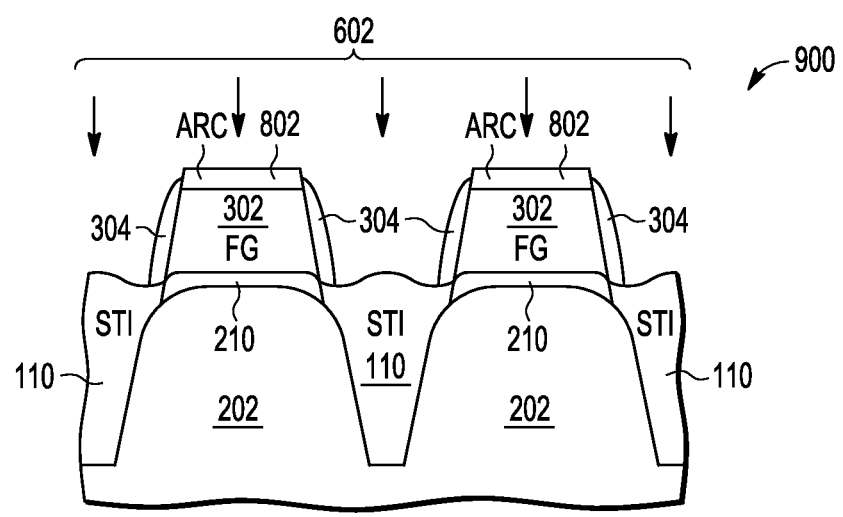
FIG. 9 is a cross-section view diagram of an embodiment after a spacer etch processing step has been used to etch the embodiment of FIG. 8.

FIG. 9 is a cross-section view diagram of an embodiment 900 after a spacer etch processing step 602 has been used to etch the additional floating gate layer 502 in FIG. 8. In contrast to FIG. 6, the ARC layers 802 provide an etch stop for the floating gate regions 302. For FIG. 6, the etch processing step 602 will etch into the floating gate regions 302 if the etch processing is not stopped after the additional floating gate layer 502 above the floating gate regions 302 has been etched away. As shown in FIG. 9, however, the ARC layers 802 provide an etch stop that keeps the etch processing step 602 from etching into the top of the floating gate regions 302. After the etch processing step 602 has been completed, the ARC layers 802 can then be removed prior to formation of the dielectric layer 208 and control gate layer 112. Other variations could also be implemented.

Figure 10:
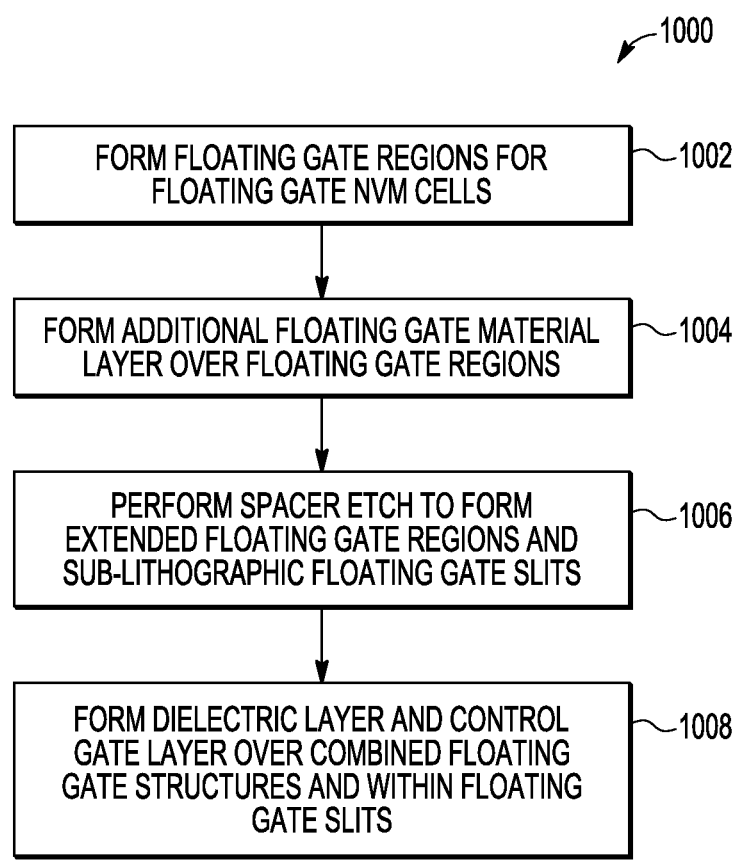
FIG. 10 is a process flow diagram of an embodiment for forming extended floating gate structures having sub-lithographic features.

FIG. 10 is a process flow diagram of an embodiment 1000 for forming extended floating gate structures having sub-lithographic features. In block 1002, floating gate regions are formed for floating-gate NVM cells, for example, within an array of NVM cells. As described above, the floating gate regions are formed with slits between the floating gate regions. As also described herein, the floating gate regions can be formed above gate oxide layers, which are in turn formed over doped regions within a semiconductor substrate. In block 1004, an additional floating gate material layer is formed over the floating gate regions. As described above, intervening etch stop layers, such as ARC layers, can also be formed prior to forming the additional floating gate material layer. In block 1006, a spacer etch processing step is performed to form extended floating gate regions adjacent the floating gate regions and to form sub-lithographic floating gate slits between the resulting combined floating gate structures, as described herein. In block 1008, a dielectric layer and control gate layer are then formed over the combined floating gate structures and within the floating gate slits. It is further noted that different and/or additional processing steps could also be utilized while still forming extended floating gate regions and sub-lithographic features, as described herein.

Figure 11:
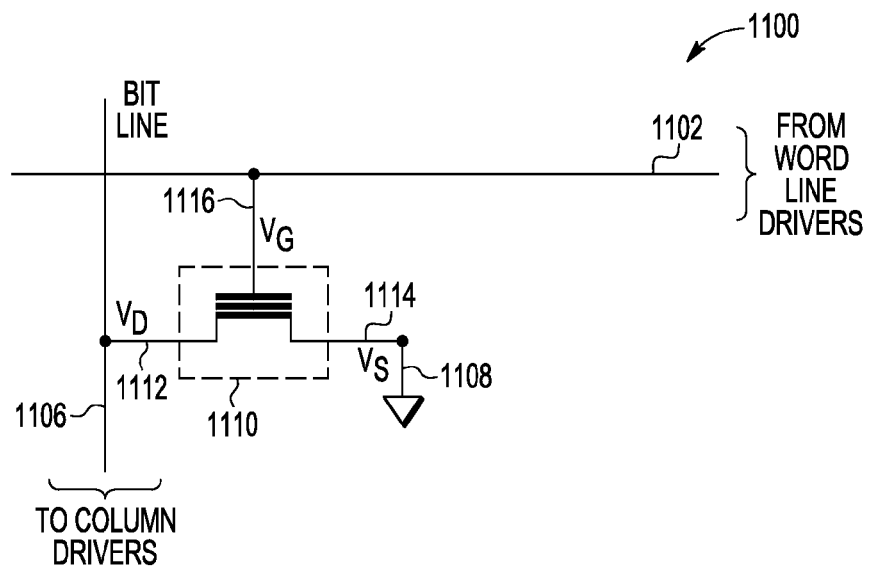
FIG. 11 is a diagram of an embodiment for example connections associated with a floating-gate NVM cell having extended floating gate regions.

FIG. 11 is a diagram of an embodiment 1100 for example connections associated with a floating-gate NVM cell 1110 having extended floating gate regions, as described herein. For the embodiment depicted, a source voltage ($V_S$) 1114 is provided by a connection to ground 1108. A drain voltage ($V_D$) 1112 is provided by a connection to the column bit-line 1106, which is in turn coupled to column driver circuitry. A control gate voltage ($V_G$) 116 is provided by a connection to a wordline 1102, which is turn coupled to wordline driver circuitry.

Figure 12:
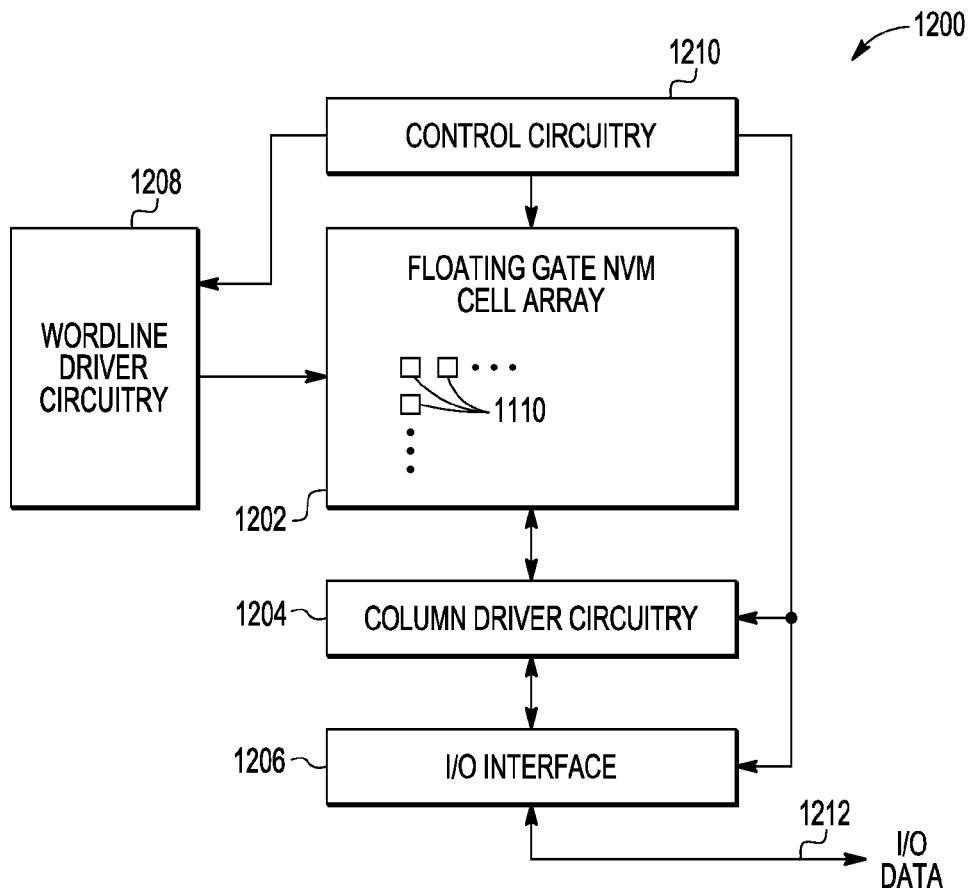
FIG. 12 is a block diagram of an embodiment for a floating-gate NVM system including a memory cell array having a plurality of floating-gate NVM cells, each having extended floating gate regions.

FIG. 12 is a block diagram of an embodiment for a floating-gate NVM system 1200 including a memory cell array 1202 having a plurality of floating-gate NVM cells 1110, each having extended floating gate regions, as described herein. The floating-gate NVM cell array 1202 is coupled to wordline (WL) driver circuitry 1208, which provides wordline voltages to the floating-gate NVM cells 1110 within the memory cell array 1202. The floating-gate NVM cell array 1202 is also coupled to column driver circuitry 1204. For read and verify operations, the column driver circuitry 1204 determines charge levels stored in selected NVM cells within the array 1202 and outputs related data to an input/output (I/O) interface 1206. For program and erase operations, the column driver circuitry 1204 provides program/erase voltage levels to selected NVM cells within the array 1202. Control circuitry 1210 provides control signals to the wordline (WL) driver circuitry 1208, the column driver circuitry 1204, the NVM cell array 1202, and the I/O interface 1206. It is further noted that the array of floating-gate NVM cells 1202, the wordline driver circuitry 1208, the column driver circuitry 1204, the control circuitry 1210, and/or the I/O interface 1206 can be integrated within a single integrated circuit. It is further noted that the input/output (I/O) output data channel 1212 coupled to the I/O interface 1206 can be used internally within an integrated circuit or can be used to communicate data externally from the integrated circuit within which the floating-gate NVM system 1200 is integrated. Other variations could also be implemented while still utilizing floating-gate NVM cells that have extended floating gate regions formed by spacer etch processing steps, as described herein.

As described herein, a variety of embodiments can be implemented and different features and variations can be implemented, as desired.

In one embodiment, a method of forming floating-gate NVM cells is disclosed that includes forming floating gate regions over a substrate for a plurality of floating gate cells, the floating gate regions being separated by slits, forming a layer of floating gate material over the substrate including over the floating gate regions, and etching the layer to form extended floating gate regions as sidewall structures adjacent the floating gate regions such that each floating gate cell comprises a floating gate structure that includes the floating gate region and extended floating gate regions as sidewall structures. For further embodiments, the slits between the floating gate regions have widths based upon dimensions allowed by a lithography tool, and the extended floating gate regions reduce the widths for the slits to sub-lithographic dimensions.

In other embodiments, the floating gate regions and the extended floating gate regions are a common material. Further, the common material can be doped polysilicon. For further embodiments, the method includes forming a control gate layer over the floating gate regions and the extended floating gate regions such that the control gate layer fills the slits. In addition, the control gate layer can be doped polysilicon. For still further embodiments, the method can include forming a dielectric layer over the floating gate regions and the extended floating gate regions prior to forming the control gate layer.

In additional embodiments, the etching step can include a spacer etch. Further, the spacer etch can be a timed etch. Also, the spacer etch can be an anisotropic etch. In addition, the floating gate regions and the extended floating gate regions can be doped polysilicon. For still further embodiments, prior to forming the layer of floating gate material, the method can further include forming a protective layer over the floating gate regions and using the protective layer as an etch stop for the etching step. Further, the method can include removing the protective layer after the etching step. Still further, the method can include forming gate oxide regions over the substrate before forming the floating gate regions.

In one other embodiment, an integrated circuit is disclosed that includes a plurality of floating-gate non-volatile memory (NVM) cells with each floating-gate NVM cell including a floating gate, and each floating gate includes a floating gate region and extended floating gate regions adjacent the floating gate region as sidewall structures, where the floating gates for the floating-gate NVM cells are separated by slits having widths with sub-lithographic dimensions.

In other embodiments, the floating gate regions and the extended floating gate regions can be a common material. Further, the common material can be doped polysilicon. In addition, a control gate layer can be formed over the floating gates and within the slits. The control gate layer can also be doped polysilicon. For still further embodiments, a gate oxide region can be formed between a substrate and the floating gates for the NVM cells.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method of forming floating-gate non-volatile memory (NVM) cells, comprising:
   providing a semiconductor substrate having doped well regions and gate oxide regions for a plurality of floating gate cells and intervening shallow trench isolation (STI) regions between the doped well regions and the gate oxide regions;
   forming floating gate regions over the doped well regions and the gate oxide regions for the plurality of floating gate cells, the floating gate regions being separated by slits positioned over the STI regions;
   forming a layer of floating gate material over the substrate including over the floating gate regions; and
   etching the layer to form extended floating gate regions as sidewall structures adjacent the floating gate regions such that each floating gate cell comprises a floating gate structure that includes the floating gate region and extended floating gate regions as sidewall structures.

2. The method of claim 1, wherein the slits between the floating gate regions have widths based upon dimensions allowed by a lithography tool, and wherein the extended floating gate regions reduce the widths for the slits to sub-lithographic dimensions.

3. The method of claim 2, wherein the floating gate regions and the extended floating gate regions comprise a common material.

4. The method of claim 3, wherein the common material comprises doped polysilicon.

5. The method of claim 2, further comprising forming a control gate layer over the floating gate regions and the extended floating gate regions, the control gate layer filling the slits.

6. The method of claim 5, wherein the control gate layer comprises doped polysilicon.

7. The method of claim 5, further comprising forming a dielectric layer over the floating gate regions and the extended floating gate regions prior to forming the control gate layer.

8. The method of claim 2, wherein the etching step comprises a spacer etch.

9. The method of claim 8, wherein the spacer etch is a timed etch.

10. The method of claim 8, wherein the spacer etch comprises an anisotropic etch.

11. The method of claim 10, wherein the floating gate regions and the extended floating gate regions comprise doped polysilicon.

12. The method of claim 2, further comprising using anti-reflective coating (ARC) layers over the floating gate regions as an etch stop for the etching step.

13. The method of claim 12, further comprising removing the anti-reflective coating (ARC) layers after the etching step.

* * * * *